(12) United States Patent
Sato et al.

(10) Patent No.: US 8,293,583 B2
(45) Date of Patent: Oct. 23, 2012

(54) METHOD FOR MANUFACTURING SEMICONDUCTOR DEVICE

(75) Inventors: Takao Sato, Edogawa-ku (JP);
Masayuki Miura, Ota-ku (JP); Taku Kamoto, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/215,427

(22) Filed: Aug. 23, 2011

(65) Prior Publication Data
US 2012/0052632 A1 Mar. 1, 2012

(30) Foreign Application Priority Data

Aug. 25, 2010 (JP) .................... 2010-188524

(51) Int. Cl.
*H01L 21/50* (2006.01)
(52) U.S. Cl. ........................ 438/113; 257/620
(58) Field of Classification Search .................. 438/113, 438/106; 257/620, E21.503
See application file for complete search history.

(56) References Cited

U.S. PATENT DOCUMENTS

| 7,985,663 | B2 | 7/2011 | Sato et al. | |
| 2004/0023438 | A1* | 2/2004 | Egawa et al. | 438/113 |
| 2004/0097054 | A1* | 5/2004 | Abe | 438/460 |
| 2004/0239349 | A1* | 12/2004 | Yamagishi et al. | 324/754 |
| 2005/0142691 | A1* | 6/2005 | Shibata | 438/106 |
| 2005/0263759 | A1* | 12/2005 | Shiozawa | 257/48 |
| 2007/0275507 | A1* | 11/2007 | Muraki | 438/127 |
| 2009/0110940 | A1* | 4/2009 | Hong et al. | 428/447 |
| 2010/0112783 | A1* | 5/2010 | Nakamura et al. | 438/458 |
| 2010/0120229 | A1* | 5/2010 | Nakamura et al. | 438/464 |
| 2010/0181650 | A1* | 7/2010 | Shigihara et al. | 257/620 |
| 2012/0032298 | A1* | 2/2012 | Miyagawa et al. | 257/531 |

FOREIGN PATENT DOCUMENTS

JP 2010-10644 1/2010

* cited by examiner

*Primary Examiner* — Thao P. Le
(74) *Attorney, Agent, or Firm* — Oblon, Spivak, McClelland, Maier & Neustadt, L.L.P.

(57) ABSTRACT

In one embodiment, a separation layer and a wiring layer are formed in order on a supporting substrate. A plurality of semiconductor chips are mounted on the wiring layer. The plural semiconductor chips are collectively sealed by a sealing resin layer. A resin-sealed body is evenly held by a holder. The resin-sealed body is separated from the supporting substrate by shearing the separation layer while being heated. The separated resin-sealed body is cooled while a state of the resin-sealed body being held evenly by the holder is maintained, and then a holding state of the resin-sealed body by the holder is released. The resin-sealed body is cut to singulate a circuit structure body.

20 Claims, 12 Drawing Sheets

METHOD FOR MANUFACTURING SEMICONDUCTOR DEVICE

CROSS-REFERENCE TO RELATED APPLICATION

This application is based upon and claims the benefit of priority from Japanese Patent Application No. 2010-188524, filed on Aug. 25, 2010; the entire contents of which are incorporated herein by reference.

FIELD

Embodiments described herein relate generally to a method for manufacturing a semiconductor device.

BACKGROUND

In a small-sized and thin portable electronic device such as a mobile phone, an area on which a semiconductor device is mounted is narrow, and its height is low. A thin semiconductor device such as a double-sided mounting semiconductor device having semiconductor chips mounted on both surfaces of a substrate has been required. The thin semiconductor device is manufactured in the following manner, for example. First, a wiring layer is formed on a predetermined supporting substrate, and then a semiconductor chip is mounted on a front surface of the wiring layer. The semiconductor chip is resin-sealed to obtain a resin-sealed body, and then the supporting substrate is removed, and thereby the thin semiconductor device is manufactured. The double-sided mounting semiconductor device is manufactured by mounting a semiconductor chip also on a rear surface of the wiring layer.

In a manufacturing process of the above-described semiconductor device, a removing process of the supporting substrate is important. The removing process of the supporting substrate is required to enable repeated use of the supporting substrate and to simply remove the supporting substrate for a short time without causing any trouble in the semiconductor chip or the wiring layer. With respect to such a point, there has been proposed a method in which a separation layer that is formed between a supporting substrate and a wiring layer and is made of a thermoplastic resin and so on is sheared, and thereby a circuit structure body having the wiring layer, a semiconductor chip, and a sealing resin layer is separated from the supporting substrate.

On the wiring layer formed on the supporting substrate, a plurality of semiconductor chips are normally mounted. The plural semiconductor chips are collectively resin-sealed, and thereby a resin-sealed body is manufactured. The wiring layer of the resin-sealed body is cut together with a sealing resin layer, and thereby the resin-sealed body is separated into circuit structure bodies (semiconductor devices). The resin-sealed body having the plural semiconductor chips is required to suppress warpage when separating from the supporting substrate. The warpage generated in the resin-sealed body is likely to remain in the circuit structure bodies into which the resin-sealed body is separated. The warpage generated in the circuit structure bodies (semiconductor devices) becomes a factor to reduce adhesiveness and connectivity when the circuit structure body is mounted on a substrate or the like.

DETAILED DESCRIPTION

According to one embodiment, there is provided a method for manufacturing a semiconductor device including forming a separation layer on a supporting substrate, forming a wiring layer having a plurality of device forming areas and dicing areas on the separation layer, mounting a plurality of semiconductor chips on the wiring layer so as to dispose the semiconductor chips on the plural device forming areas respectively, forming a sealing resin layer covering the plural semiconductor chips on the wiring layer to obtain a resin-sealed body having the wiring layer and the plural semiconductor chips, separating the resin-sealed body from the supporting substrate, and cutting the resin-sealed body according to the dicing areas to singulate a circuit structure body provided with the wiring layer, the semiconductor chip and the sealing resin layer. In the method for manufacturing the semiconductor device as above, when the resin-sealed body is separated from the supporting substrate, or after the resin-sealed body is separated from the supporting substrate, the resin-sealed body is heated while being evenly held by a holder as a whole, and the resin-sealed body is cooled while a state of the resin-sealed body being held evenly by the holder is maintained, and then a holding state of the resin-sealed body by the holder is released.

First Embodiment

Figure 1A:
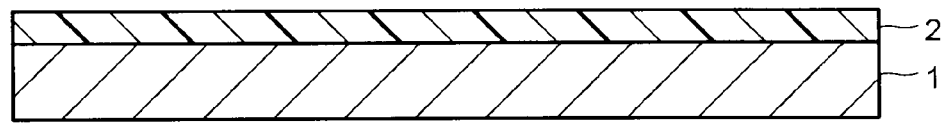
FIG. 1A to FIG. 1D are cross-sectional views showing a forming process of a separation layer to a forming process of a sealing resin layer in a method for manufacturing a semiconductor device in a first embodiment.

A method for manufacturing a semiconductor device according to a first embodiment will be explained with reference to the drawings. FIG. 1A to FIG. 1D, FIG. 2A to FIG. 2C, FIG. 3A to FIG. 3C, FIG. 4A to FIG. 4C, and FIG. 5A to FIG. 5C are views showing a manufacturing process of the semiconductor device according to the first embodiment. First, as shown in FIG. 1A, an 8-inch Si wafer or the like is prepared as a supporting substrate 1. A separation layer 2 is formed on the supporting substrate 1. The supporting substrate 1 may also be a glass substrate, a sapphire substrate, a resin substrate, or the like.

The separation layer 2 is formed of a thermoplastic resin such as, for example, a polystyrene-based resin, a methacrylic-based resin, a polyethylene-based resin, a polypropylene-based resin, a cellulose-based resin, or a polyimide-based resin. The thickness of the separation layer 2 is preferably set to fall within a range of 1 to 20 µm, and further is more preferably set to fall within a range of 3 to 15 µm. If the thickness of the separation layer 2 is less than 1 µm, there is a risk that it becomes difficult to shear off the separation layer 2 well in a separation process of the supporting substrate 1. Even in the case when the separation layer 2 is formed thickly, it is sufficient that the thickness is 20 µm or so. If the thickness of the separation layer 2 is made thicker than 20 µm or so, an increase in manufacturing cost is caused.

Figure 1B:
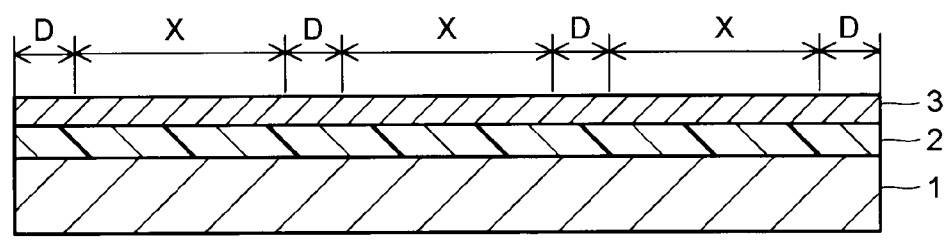
Figure 3A:
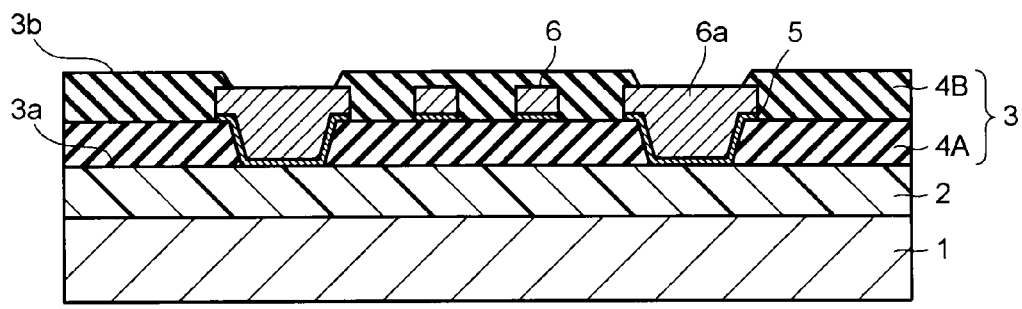
FIG. 3A to FIG. 3C are cross-sectional views showing a forming process of a wiring layer to the forming process of the sealing resin layer in an enlarged manner in a manufacturing process of the semiconductor device shown in FIG. 1A to FIG. 1D.

Next, as shown in FIG. 1B, a wiring layer 3 is formed on the separation layer 2. The wiring layer 3 has a plurality of device forming areas X and dicing areas D each provided therebetween. The wiring layer 3 has a structure as shown in FIG. 3A, and is formed in the following manner, for example. First organic insulating film 4A forming the wiring layer 3 is formed on the separation layer 2. An exposure and development treatment is performed on the first organic insulating film 4A to form opening portions. The opening portions are formed so as to correspond to connection pads to be disposed on a first surface (peeled surface from the supporting substrate 1) 3a of the wiring layer 3.

Next, metal wirings forming the wiring layer 3 are formed. For example, a plating seed layer 5 is formed on the first organic insulating film 4A, and a resist film is formed thereon and has an exposure and development treatment performed thereon, and then the plating seed layer 5 is set as an electrode and electrolytic plating is performed and metal wirings 6 are formed. The metal wirings 6 are formed of Cu, Al, Ag, Au, and so on. The plating seed layer 5 exposed on the resist film and the first organic insulating film 4A is removed, and then a second organic insulating film 4B having portions corresponding to the connection pads on a side of a second surface 3b of the wiring layer 3 opened is formed. Some of the metal wirings 6 are exposed in the openings, and these portions each form a connection pad 6a passing through an organic insulating film 4.

The connection pads 6a of the metal wirings 6 are exposed to the first and second surfaces 3a, 3b of the wiring layer 3 respectively. Exposed portions of the connection pads 6a on the side of the second surface 3b function as connection portions to a semiconductor chip to be mounted on the wiring layer 3. Exposed portions of the connection pads 6a on the side of the first surface 3a function as connection portions to another semiconductor chip, a wiring substrate, or the like. In FIG. 3A, the metal wirings 6 of a single layer are shown, but the wiring layer 3 may also be formed of metal wirings of two layers or more. The organic insulating film 4 is formed according to the number of layers of the metal wirings 6. A forming process of the wiring layer 3, which has been described here, is one example, and the wiring layer 3 may also be formed by applying another forming process.

Figure 1C:
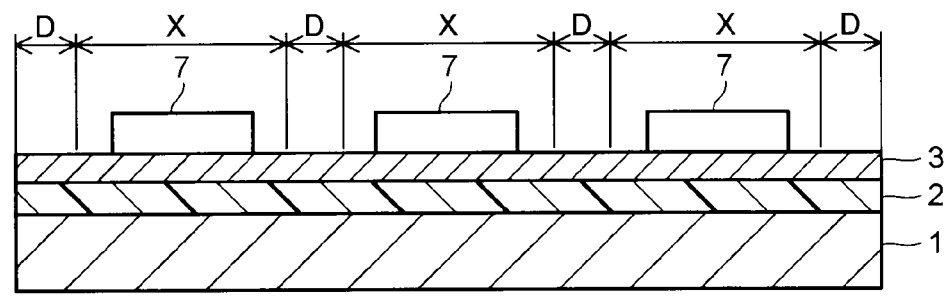
Figure 3B:
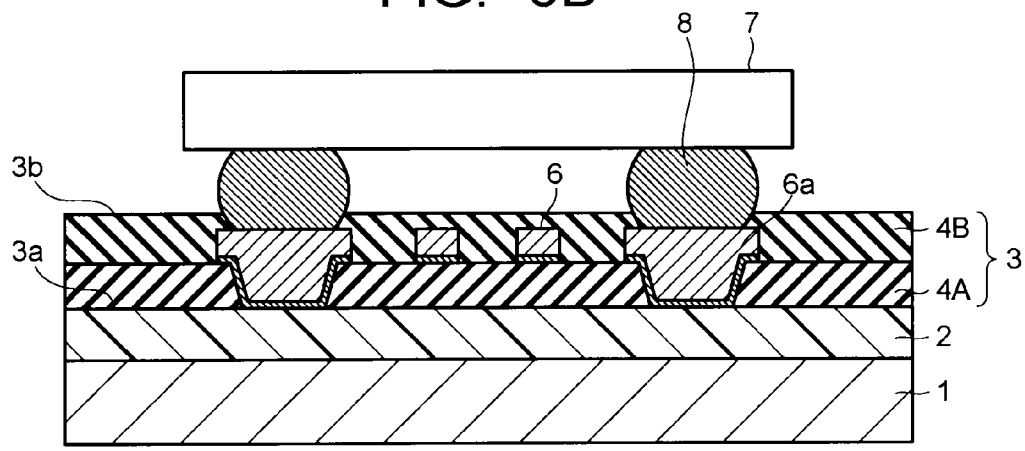

Next, as shown in FIG. 1C, a plurality of semiconductor chips 7 are mounted on the wiring layer 3. The semiconductor chips 7 are disposed on the device forming areas X of the wiring layer 3 respectively. A mounting process of the semiconductor chips 7 is conducted in a manner to apply flip-chip (FC) connection as shown in FIG. 3B, for example. That is, each of the semiconductor chips 7 has metal bumps 8 made of a Sn—Ag alloy and the like. Each of the semiconductor chips 7 is mounted such that the metal bumps 8 are connected to the exposed portions of the connection pads 6a on the side of the second surface 3b. The connection of the wiring layer 3 and the semiconductor chips 7 is not limited to the FC connection, and the wiring layer 3 and the semiconductor chips 7 may also be connected electrically in a manner to apply wire bonding.

Figure 1D:
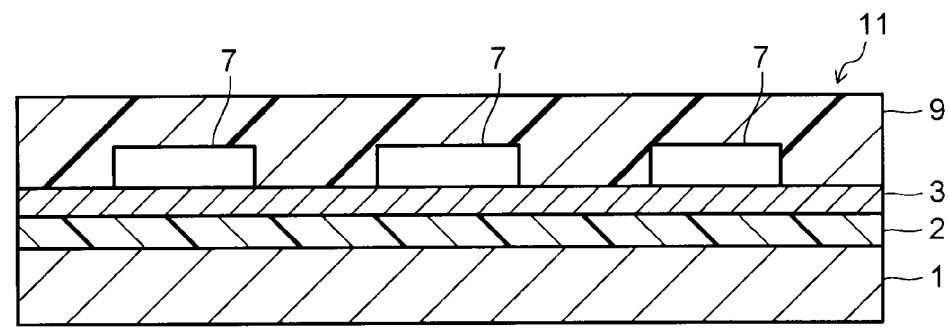
Figure 3C:
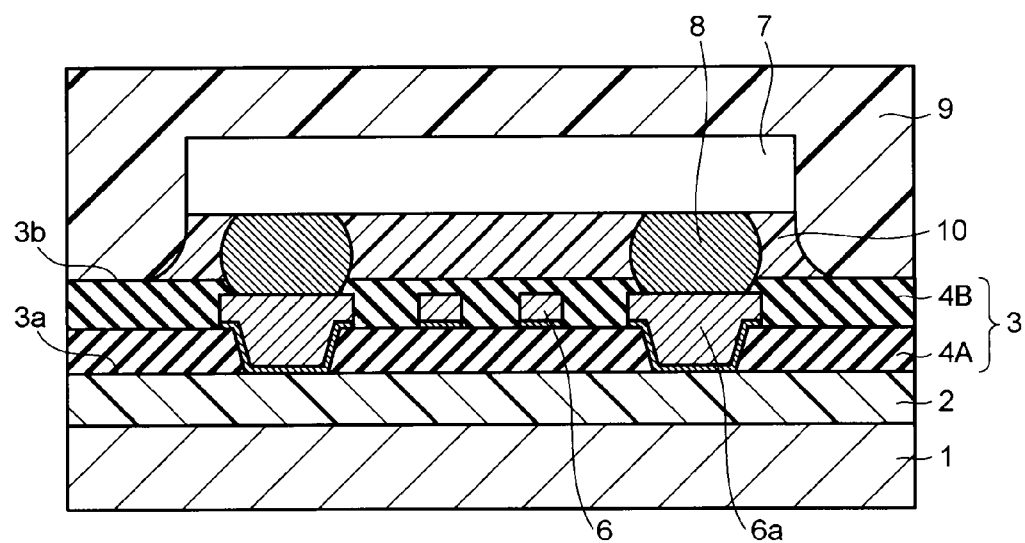

As shown in FIG. 1D and FIG. 3C, a sealing resin layer 9 is formed on the second surface 3b of the wiring layer 3. The sealing resin layer 9 is formed by molding or the like. The sealing resin layer 9, as shown in FIG. 3C, is formed after an underfill resin 10 is filled in the gap between each of the semiconductor chips 7 and the wiring layer 3 according to need. The sealing resin layer 9 is formed so as to collectively cover the plural semiconductor chips 7 mounted on the wiring layer 3. The plural semiconductor chips 7 are collectively resin-sealed on a wafer level. In this manner, a resin-sealed body 11 in which the plural semiconductor chips 7 mounted on the wiring layer 3 are collectively sealed is manufactured.

Figure 2A:
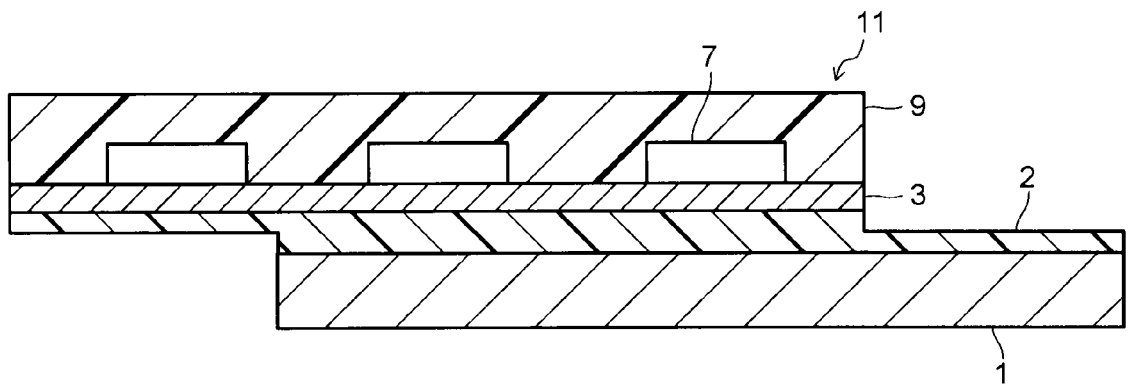
FIG. 2A to FIG. 2C are cross-sectional views showing a separation process of a resin-sealed body to a cutting process of the resin-sealed body in the method for manufacturing the semiconductor device in the first embodiment.
Figure 2B:
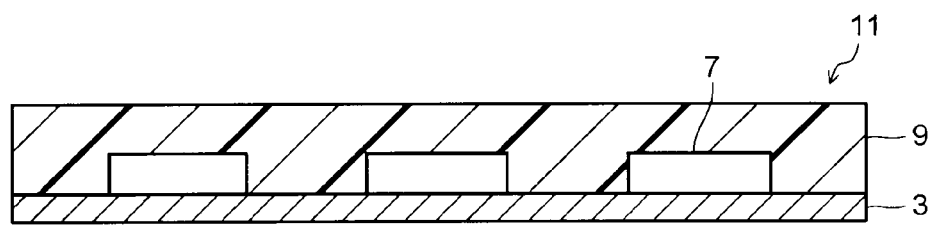
Figure 4A:
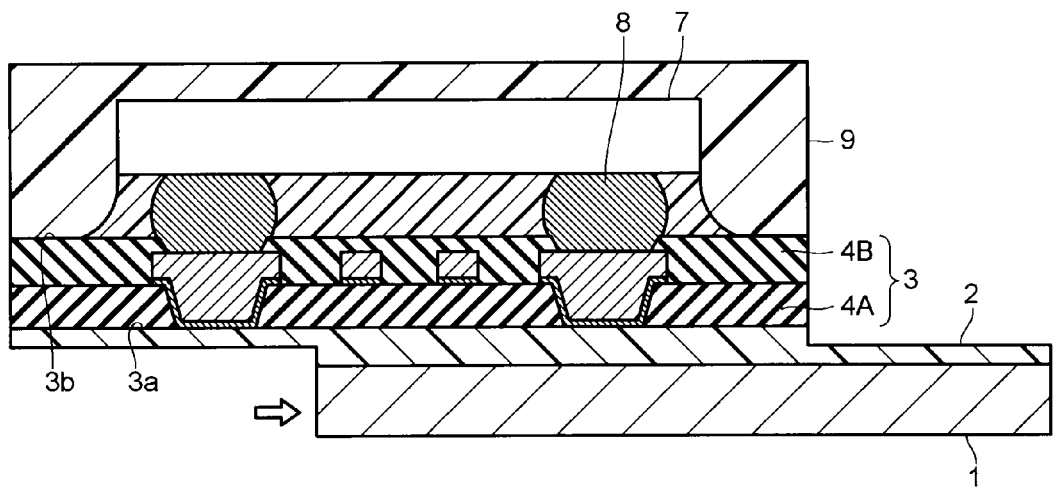
FIG. 4A to FIG. 4C are cross-sectional views showing the separation process of the resin-sealed body to a removing process of the separation layer in an enlarged manner in a manufacturing process of the semiconductor device shown in FIG. 2A to FIG. 2C.

Next, as shown in FIG. 2A and FIG. 4A, a stack provided with the supporting substrate 1 and the resin-sealed body 11 formed thereon via the separation layer 2 is heated to a predetermined temperature, and while softening a thermoplastic resin layer as the separation layer 2, the supporting substrate 1 and the resin-sealed body 11 are relatively moved in a substantially parallel direction. A shearing force generated between the supporting substrate 1 and the resin-sealed body 11 is utilized to shear the softened separation layer 2, and thereby the resin-sealed body 11 is separated from the supporting substrate 1. On this occasion, in addition to the substantially parallel movement of the supporting substrate 1 and the resin-sealed body 11, the supporting substrate 1 and the resin-sealed body 11 are also moved a little in an up and down direction, thereby enabling the separation of the resin-sealed body 11 from the supporting substrate 1 to be promoted.

The heating temperature of the thermoplastic resin layer as the separation layer 2 is preferably set to fall within a range of 220 to 260° C., for example. A heating treatment at such a temperature makes it possible to simply separate the supporting substrate 1 and the resin-sealed body 11 for a short time without causing thermal damage to the semiconductor chips 7, deformations of the portions of the FC connection and the wiring layer 3, and so on. Further, the separated supporting substrate 1 can be used repeatedly. In order to more easily perform the separation of the supporting substrate 1 and the resin-sealed body 11 by the heating treatment, viscosity of the thermoplastic resin forming the separation layer 2 is preferably 100 Pa·s or less at 250° C.

Figure 5A:
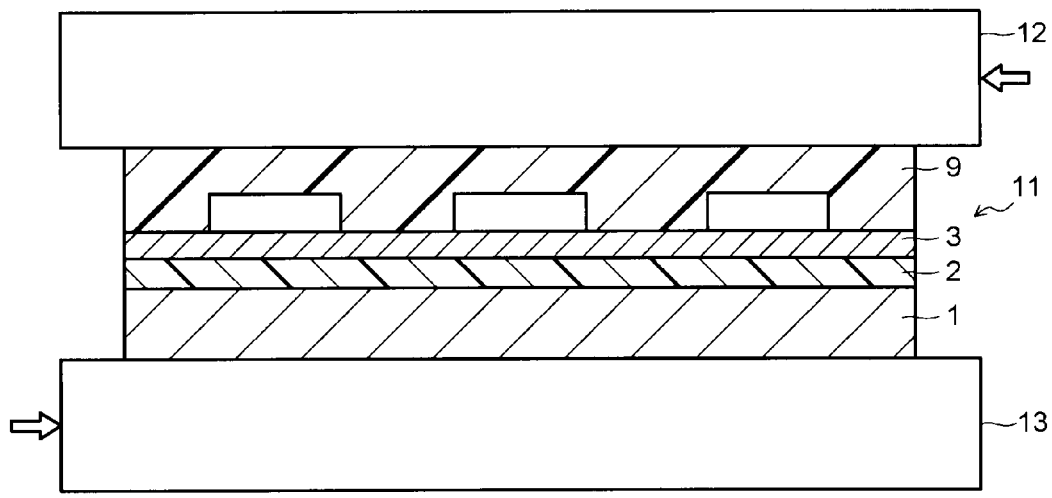
FIG. 5A to FIG. 5C are cross-sectional views showing the separation process of the resin-sealed body to a cooling process of the resin-sealed body in the manufacturing process of the semiconductor device shown in FIG. 2A to FIG. 2C.

In the separation process of the resin-sealed body 11 from the supporting substrate 1, as shown in FIG. 5A, the resin-sealed body 11 and the supporting substrate 1 are held evenly by first and second holders 12, 13 respectively. The first and second holders 12, 13 are each provided with a suction holding mechanism holding the resin-sealed body 11 or the supporting substrate 1 evenly. The resin-sealed body 11 is suction-held by the first holder 12, thereby enabling the resin-sealed body 11 to be held more evenly. A holding mechanism of the resin-sealed body 11 and the supporting substrate 1 may also be a mechanism fastening end surfaces of the resin-sealed body 11 and the supporting substrate 1 mechanically.

In the first holder 12 suction-holding the resin-sealed body 11, a heater (not-shown) is housed as a mechanism heating the separation layer 2 to a predetermined temperature, and controlling output of the heater makes it possible to heat and cool the resin-sealed body 11 with a predetermined temperature gradient. A heater (not-shown) is also housed in the second holder 13 suction-holding the supporting substrate 1 according to need. The first holder 12 and the second holder 13 are relatively movable in the parallel direction and the up and down direction, and this enables the supporting substrate 1 and the resin-sealed body 11 to move in the substantially parallel direction and further the up and down direction.

In the separation process of the resin-sealed body 11 from the supporting substrate 1, the resin-sealed body 11 and the supporting substrate 1 are evenly held by the first and second holders 12, 13 respectively, and then the resin-sealed body 11 is heated to a temperature at which the separation layer 2 is softened. In this state, the first and second holders 12, 13 are relatively moved to generate a shearing force between the resin-sealed body 11 and the supporting substrate 1, thereby shearing the separation layer 2 softened by the heating. In this manner, the separation layer 2 is sheared while being heated, and thereby the resin-sealed body 11 is separated from the supporting substrate 1.

As the heating mechanism of the separation layer 2, not only the general heater described above but also a laser and so on can be used. In such a case, the supporting substrate 1 is preferably formed of a material through which a laser is transmitted and that is likely to accumulate heat of the laser therein more than the thermoplastic resin, which is a Tempax glass, for example. Also in the case of applying the laser heating, the resin-sealed body 11 is heated to a temperature at which the separation layer 2 is softened, and then the first and second holders 12, 13 are relatively moved to generate a shearing force between the resin-sealed body 11 and the supporting substrate 1, and thereby the separation layer 2 is sheared off.

As a heating source of the separation layer 2, a heat source capable of heating an object to be heated in a non-contact manner, which is a halogen lamp, a xenon lamp, an IR heater, or the like, may also be used. By using such a heating source, either the resin-sealed body 11 or the supporting substrate 1 is heated, or both of them are heated, thereby making it possible to soften the thermoplastic resin layer being the separation layer 2 to separate the resin-sealed body 11 and the supporting substrate 1. As the supporting substrate 1 to be used in this occasion, it is preferable to use a material making full use of characteristics of a light transmitting property of visible light, infrared ray or the like emitted from the heat source, a heat accumulating property of thermal energy from the heat source, and so on, which is a material to which glass and a carbon-based material are added, a material to which SUS and a carbon-based material are added, or the like.

Figure 5B:
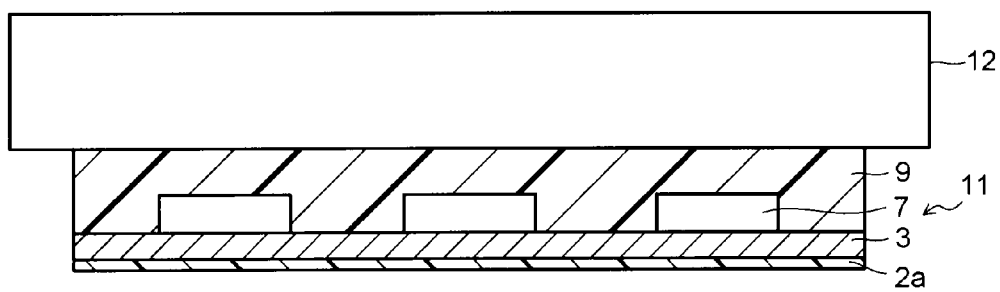

The resin-sealed body 11 separated from the supporting substrate 1, as shown in FIG. 5B, is cooled while the state of the resin-sealed body 11 being evenly held by the first holder 12 is maintained. In the case when the separation layer 2 is sheared to separate the resin-sealed body 11 from the supporting substrate 1, a residue layer 2a of the separation layer 2 remains on the first surface 3a of the wiring layer 3. In a cooling process of the resin-sealed body 11, the resin-sealed body 11 is heated to a temperature equal to or higher than a glass transition point of the sealing resin layer 9 continuously from the separation process, and then is cooled to a temperature lower than the glass transition point, or the resin-sealed body 11 that is cooled after the holding state is once released is evenly held by the holder 12 again and is heated and cooled as described above. Also in both the cases, an effect of suppressing warpage of the resin-sealed body 11 can be obtained. The heating temperature of the resin-sealed body 11 is preferably set to a temperature 5 to 15° C. higher than the glass transition point of the sealing resin. This makes it possible to effectively correct the warpage of the resin-sealed body 11.

Figure 5C:
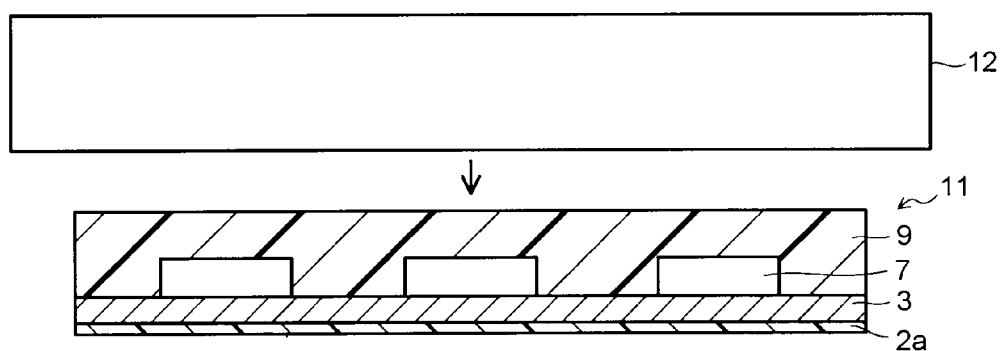

The resin-sealed body 11 is cooled by the predetermined cooling process, and then as shown in FIG. 5C, the holding state of the resin-sealed body 11 by the first holder 12 is released. While the state of the resin-sealed body 11 being evenly held by the first holder 12 is maintained, the resin-sealed body 11 heated to a temperature equal to or higher than the glass transition point of the sealing resin layer 9 is cooled to a temperature lower than the glass transition point of the sealing resin layer 9, and after the cooling, the holding state of the resin-sealed body 11 is released. It possible to suppress the warpage of the resin-sealed body 11 based on stress or the like applied to the resin-sealed body 11 when the separation layer 2 is sheared.

In the cooling process of the resin-sealed body 11, the holding state of the resin-sealed body 11 by the first holder 12 is preferably maintained to a temperature lower than a glass transition point (Tg) of a sealing resin (for example, an epoxy resin) forming the sealing resin layer 9, which is, for example, a temperature 10° C. lower than the glass transition point. The resin-sealed body 11 is continued to be evenly held by the first holder 12 to such a temperature, and thereby an effect of correcting the warpage of the resin-sealed body 11 can be obtained effectively. Thus, it becomes possible to suppress the warpage of the resin-sealed body 11 after the holding state by the first holder 12 is released. The glass transition point of the epoxy resin used as the sealing resin is 130 to 170° C. or so, and a modulus of elasticity at normal temperature is 20 to 30 GPa or so.

The cooling process of the resin-sealed body 11 is preferably controlled such that at least a temperature gradient (cooling rate) of a temperature zone passing through the glass transition point (Tg) of the sealing resin (temperature zone around Tg) falls within a range of 1 to 10° C./minute. The shape of the heated sealing resin layer 9 also changes according to a temperature condition at the time of cooling. If the temperature gradient (cooling rate) of the temperature zone passing through the glass transition point is too large due to the effect of a cooling condition at the time when the sealing resin layer 9 passes through the glass transition point of the sealing resin, it is not possible to sufficiently release the stress generated in the sealing resin layer 9 (stress to generate the warpage). Thus, there is a risk that the warpage remains in the resin-sealed body 11 released from the state of being held by the first holder 12.

When the resin-sealed body 11 is cooled, the temperature gradient of the temperature zone passing through the glass transition point of the sealing resin is preferably set to 10° C./minute or less. However, if the temperature gradient at the time of cooling is reduced, the time required for the cooling process is prolonged correspondingly, resulting that the cost for manufacturing the semiconductor device is increased. The temperature gradient of the temperature zone passing through the glass transition point of the sealing resin is preferably set to 1° C./minute or more. Even though the temperature gradient at the time of cooling is set to less than 1° C./minute, it is not possible to make the effect of correcting the warpage of the sealing resin layer 9 more enhanced, and the prolongation of the time for the cooling process and further the increase in the manufacturing cost of the semiconductor device become noticeable. It is more preferable to make the temperature gradient of the temperature zone passing through the glass transition point close to 10° C./minute if possible in order to increase production efficiency.

Figure 6:
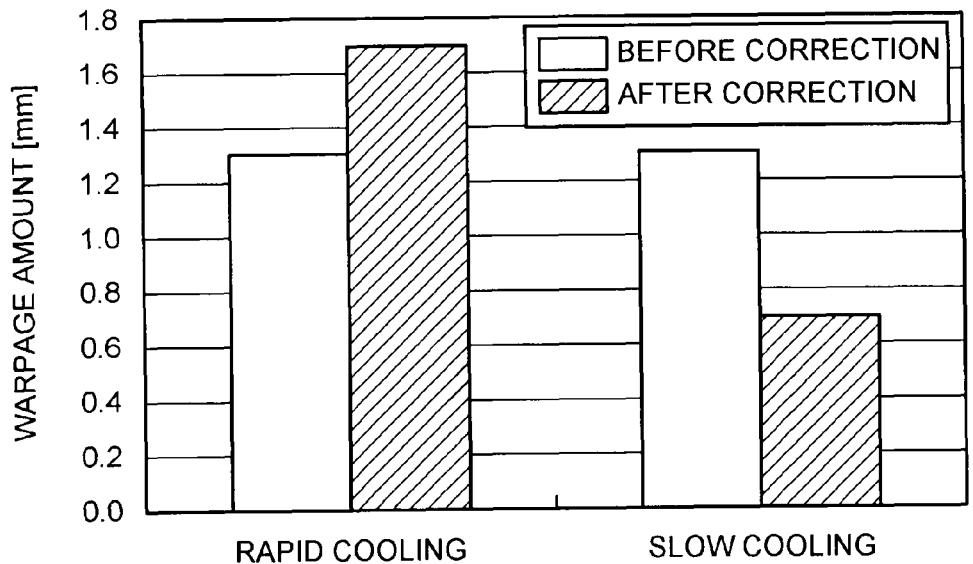
FIG. 6 is a view showing a result after a warpage amount in the case when the resin-sealed body is slow cooled is compared with a warpage amount in the case when the resin-sealed body is rapid cooled to be evaluated.

There is shown a result obtained after a warpage amount in the case of the sealing resin layer 9 after the heating being slow cooled and a warpage amount in the case of the sealing resin layer 9 after the heating being rapid cooled are evaluated in FIG. 6. In the evaluation of the slow cooling, the sealing resin (epoxy resin/Tg=around 150° C.) was heated to 200° C. on a suction stage, and the softened sealing resin was allowed to stand for 5 minutes and then was sucked, and while the suction was maintained, the sealing resin was slow cooled at 3° C./minute to be corrected, and then a warpage amount before the correction and a warpage amount after the correction were compared. In the evaluation of the rapid cooling, the similar sealing resin was heated to 200° C. on a hot plate, and the softened sealing resin was allowed to stand for 5 minutes and then was placed on a suction stage. While being sucked, the sealing resin was rapid cooled at 100° C./minute to be corrected, and then a warpage amount before the correction and a warpage amount after the correction were compared. As is clear from FIG. 6, it is found that the effect of correcting the warpage is high in the case of the slow cooling.

Figure 7:
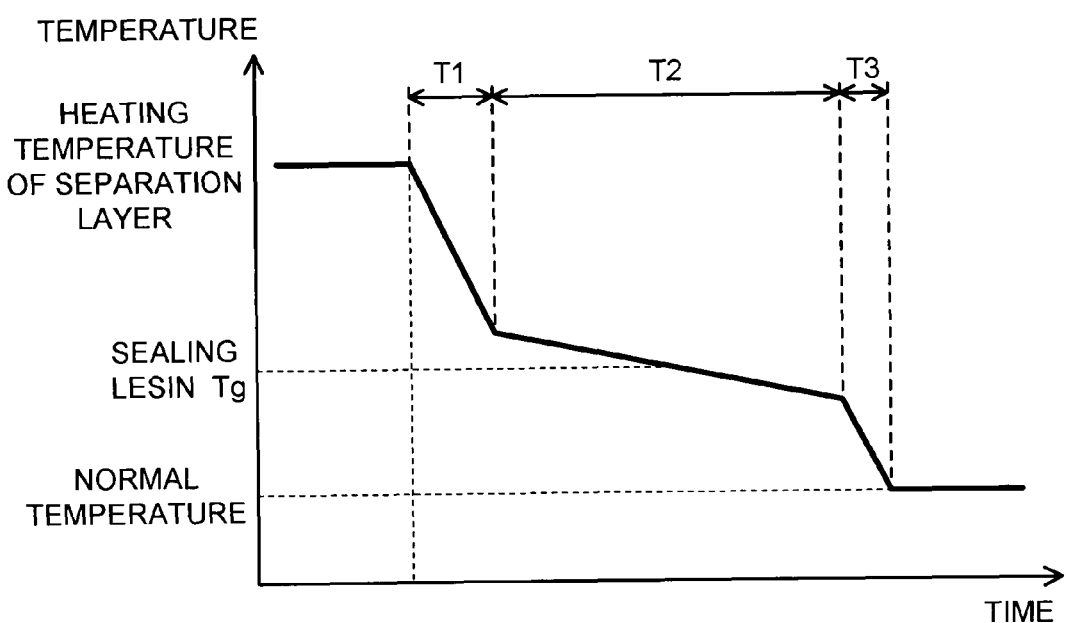
FIG. 7 is a view showing one example of a temperature profile in the cooling process of the resin-sealed body.

The cooling rate of 1 to 10° C./minute may also be applied to the entire cooling process from the heating temperature of the separation layer 2 to normal temperature, but if the cooling rate of the entire cooling process falls within the above-described range, production efficiency of the semiconductor device is reduced. Further, the warpage of the sealing resin layer 9 is affected by the cooling rate of the temperature zone passing through the glass transition point of the sealing resin. Thus, also in the case when only the cooling rate of the temperature zone passing through the glass transition point is set to fall within the range of 1 to 10° C./minute, the effect of correcting the warpage can be obtained. As shown in FIG. 7, it is preferable that a temperature gradient of a temperature zone (first temperature zone T1) prior to the temperature zone passing through the glass transition point Tg and a temperature gradient of a temperature zone (third temperature zone T3) subsequent to the temperature zone passing through the glass transition point Tg are made larger than the temperature gradient (for example, 1 to 10° C./minute) of the temperature zone passing through the glass transition point Tg (second temperature zone T2).

In a temperature profile in FIG. 7, the second temperature zone T2 is preferably set to fall within a range of a temperature 5 to 15° C. higher than the glass transition point Tg to a temperature 5 to 15° C. lower than the glass transition point Tg. The cooling rate (temperature gradient) of the second temperature zone T2 is preferably set to fall within the range of 1 to 10° C./minute as described above. The first temperature zone T1 is preferably set to fall within a range of the heating temperature of the separation layer 2 to a temperature 5 to 15° C. higher than the glass transition point Tg. The third temperature zone T3 is preferably set to fall within a range of a temperature 5 to 15° C. lower than the glass transition point Tg to normal temperature. The cooling rates (temperature gradients) of the temperature zones T1, T3 are each preferably set to fall within a range of 10 to 50° C./minute.

In the cooling process of the resin-sealed body 11, slow cooling is performed (with the temperature gradient of, for example, 1 to 10° C./minute) in the temperature zone passing through the glass transition point Tg (second temperature zone T2) as described above, and the temperature gradients in the temperature zones (first and third temperature zones T1, T3) prior to and subsequent to the second temperature zone T2 are made larger than that of the second temperature zone T2, and thereby it is possible to effectively correct the warpage of the resin-sealed body 11 and to suppress the reduction in the production efficiency of the semiconductor device. That is, it becomes possible to efficiently manufacture the sound resin-sealed body 11 with reduced warpage and further the semiconductor device at a low cost.

Figure 8:
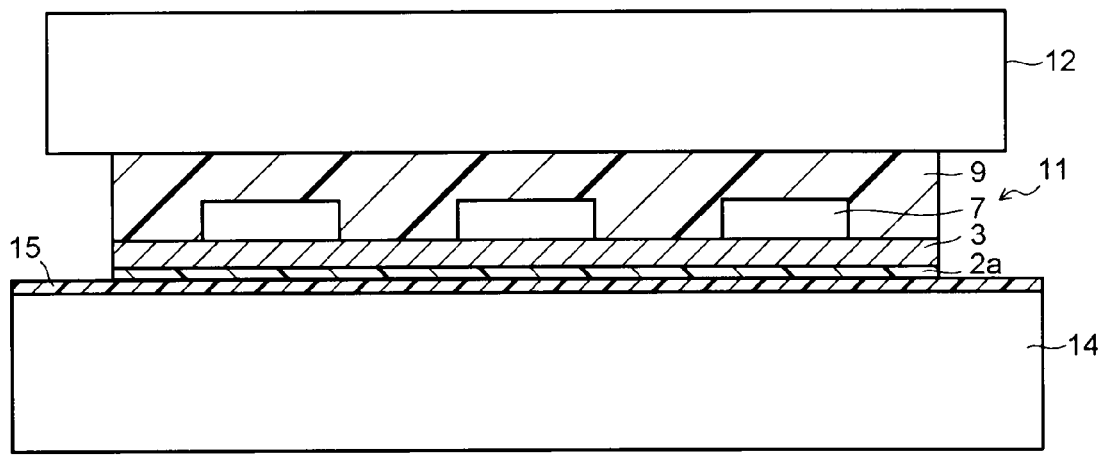
FIG. 8 is a cross-sectional view showing another example of the cooling process of the resin-sealed body.

The resin-sealed body 11 obtained after the separation layer 2 is sheared off is cooled with the predetermined temperature profile while controlling the output of the heater housed in the first holder 12, for example. However, there is sometimes a case that the sufficient cooling rate cannot be obtained depending on the resin-sealed body 11. In terms of such a point, as shown in FIG. 8, the resin-sealed body 11 held by the first holder 12 is made to come into contact with a radiator 14, thereby enabling cooling efficiency to be enhanced. The residue layer 2a of the separation layer 2 remains on the first surface 3a of the wiring layer 3, so that a release layer (a coating layer, a release film, or the like made of a fluorine-based resin) 15 is preferably provided on the surface of the radiator 14 in order to prevent the residue layer 2a in a molten state from adhering to the radiator 14.

The radiator 14 is formed of a member having a thermal conductivity according to the cooling rate. For example, the holder (heating stage) 12 having the heater housed therein is generally formed of aluminum having a high thermal conductivity (thermal conductivity=240 W/m·K). The resin-sealed body 11 is made to come into contact with the radiator 14 made of a member having a thermal conductivity lower than that of aluminum and is cooled, and thereby the moderate cooling rate (slow cooling rate) can be achieved. As such a member, alumina (thermal conductivity=36 W/m·K), stainless steel (thermal conductivity=27 W/m·K), quartz glass (thermal conductivity=1.4 W/m·K), silicone rubber (thermal conductivity=0.2 W/m·K), and so on are cited. The radiator 14 has a not-shown heat release mechanism, and this makes the temperature control possible.

The resin-sealed body 11 is made to come into contact with the radiator 14 made of a member having a relatively low thermal conductivity and is cooled, and thereby, for example, the slow cooling rate in the second temperature zone T2 in FIG. 7 can be obtained effectively. The cooling rates in the first and third temperature zones T1, T3 in FIG. 7 can be achieved by making the resin-sealed body 11 come into contact with the radiator 14 made of, for example, aluminum having a high thermal conductivity or the like. In this manner, a plurality of the radiators 14 made of members different in thermal conductivity are prepared and the resin-sealed body 11 is made to come into contact with the radiator 14 according to the cooling rate, and thereby it is possible to efficiently cool the resin-sealed body 11 while controlling the cooling rate of the resin-sealed body 11. Controlling the output of the heater, coming into contact with and leaving from the radiator 14 are combined, thereby enabling the resin-sealed body 11 to be cooled more efficiently.

Figure 4B:
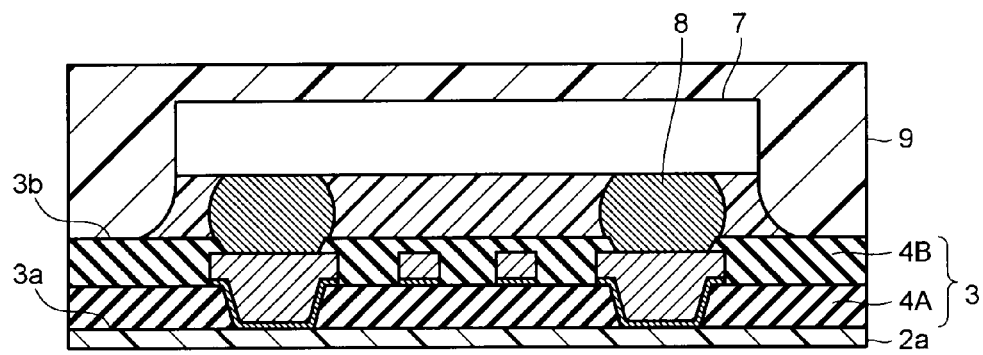

The resin-sealed body 11 after the cooling has the residue layer 2a of the separation layer 2 generated on the first surface 3a of the wiring layer 3 as shown in FIG. 4B, so that the residue layer 2a is removed by a solvent of acetone, propylene glycol monomethylether acetate (PGMEA), or the like. Further, the plating seed layer 5 exposed to the first surface 3a of the wiring layer 3 is etched to be removed. Thereby, the connection pads (Cu pads or the like) 6a are exposed to the first surface 3a of the wiring layer 3.

Not only the method in which the separation layer 2 made of the above-described thermoplastic resin layer is softened to be sheared off but also a method in which a metal layer of Cu and the like is formed as a separation layer and a bonding interface of the above separation layer is mechanically peeled off, a method of melting a separation layer formed of an organic matter by a solvent, a method of removing a separation layer by wet etching or dry etching, and so on can be applied to the separation process of the resin-sealed body 11 from the supporting substrate 1. Further, a method in which a separation layer is formed of a light-curing resin (UV-curing resin or the like) and is irradiated with UV light via the supporting substrate 1 made of glass to be separated, a method in which a separation layer is formed of a photolytic resin and is irradiated with laser light or ultraviolet light via the supporting substrate 1 made of glass and the separation layer is decomposed to be separated, and so on may also be applied.

In the case when the separation process without heating is applied, the resin-sealed body 11 is separated from the supporting substrate 1 and then is evenly held by the holder 12. In this state, the resin-sealed body 11 is heated to a temperature equal to or higher than the glass transition point of the sealing resin layer 9 and then is cooled to a temperature lower than the glass transition point. After the cooling, the holding state of the resin-sealed body 11 by the holder 12 is released. In this manner, even in the case when the heating process and the cooling process (planarizing process) of the resin-sealed body 11 are conducted separately from the separation process, it is possible to correct and suppress the warpage of the resin-sealed body 11. Concrete conditions in the cooling process (the temperature gradient at the time of cooling, the temperature zone to which the temperature gradient is applied, and so on) are the same as those described above.

Figure 2C:
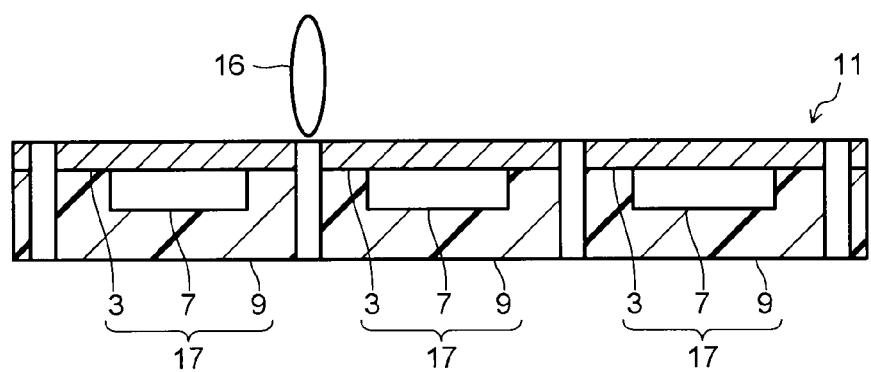
Figure 4C:
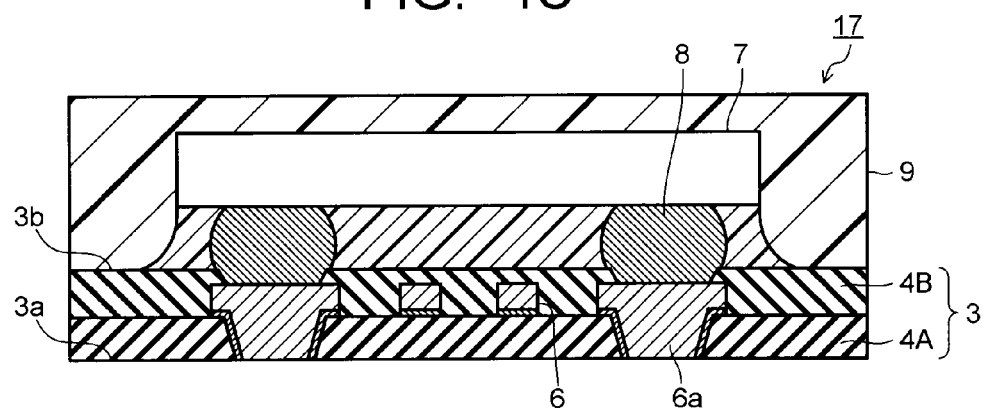

The resin-sealed body 11 in which the warpage is corrected is cut along the dicing areas D by a blade 16, and thereby as shown in FIG. 2C and FIG. 4C, circuit structure bodies (semiconductor devices) 17 each provided with the wiring layer 3, the semiconductor chip 7, and the sealing resin layer 9 are separated into pieces respectively. The semiconductor devices 17 obtained in this manner each can be obtained in a sound state where the warpage and the like are reduced because the warpage of the resin-sealed body 11 in which the plural semiconductor chips 7 are collectively sealed is suppressed. It becomes possible to enhance mountability of the semiconductor device 17 onto a substrate and the like.

Figure 9:
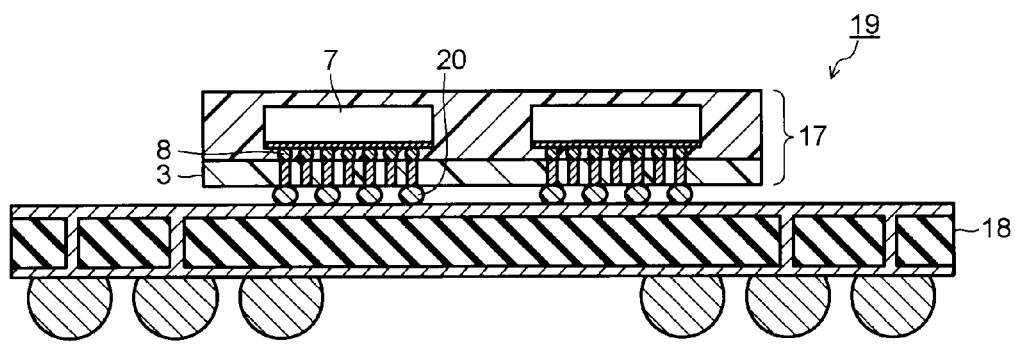
FIG. 9 is a cross-sectional view showing one example of a semiconductor package using the semiconductor device manufactured in the first embodiment.

The semiconductor device 17 manufactured in the above-described manufacturing process is mounted on a package substrate 18 as shown in FIG. 9, for example, and thereby a semiconductor package 19 is manufactured. The semiconductor device 17 and the package substrate 18 are connected by metal bumps 20 formed on the connection pads 6a of the wiring layer 3. Mountability of the semiconductor device 17 onto the package substrate 18 can be enhanced because occurrence of the warpage is suppressed. The semiconductor package 19 can also be manufactured in a manner that the semiconductor device 17 is bonded to the package substrate 18 and the wiring layer 3 and the package substrate 18 are electrically connected by wire bonding. In such a case, it is possible to enhance adhesiveness of the semiconductor device 17 to the package substrate 18.

Figure 10:
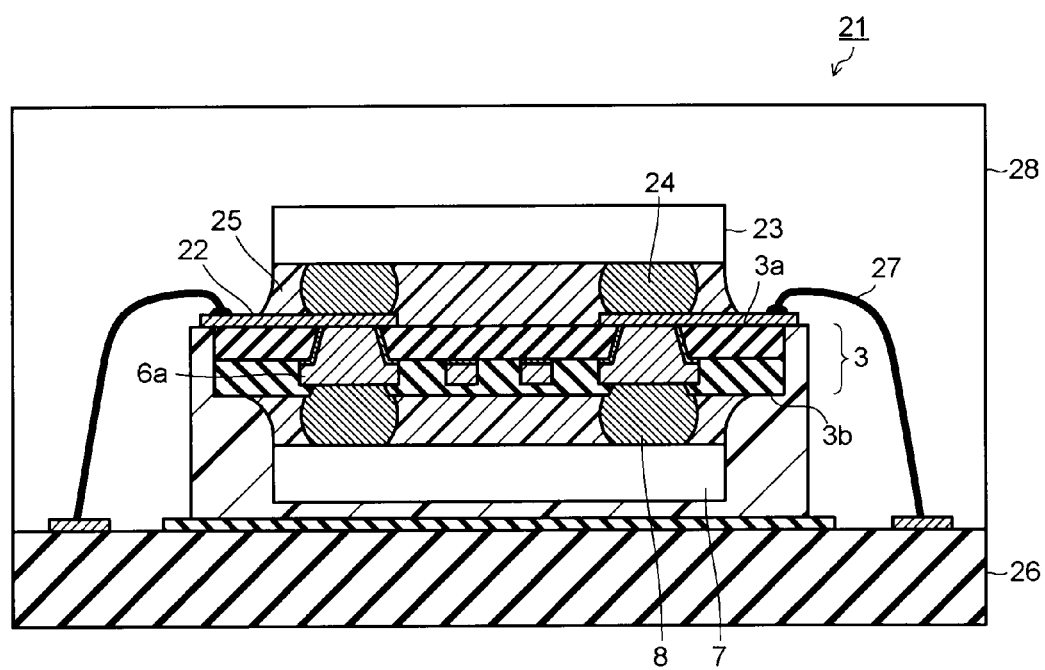
FIG. 10 is a cross-sectional view showing one example of a double-sided mounting semiconductor package using the semiconductor devices manufactured in the first embodiment.

The semiconductor device 17 can also be used as a component of a double-sided mounting semiconductor package 21 as shown in FIG. 10. In the double-sided mounting semiconductor package 21 shown in FIG. 10, wirings 22 are formed on the connection pads 6a exposed to the first surface 3a of the wiring layer 3. Metal bumps 24 of a second semiconductor chip 23 are FC-connected to the wirings 22. An underfill resin 25 is filled between the second semiconductor chip 23 and the wiring layer 3. The first semiconductor chip 7 is mounted on the second surface 3b of the wiring layer 3, so that the first and second semiconductor chips 7, 23 are mounted on the both surfaces of the wiring layer 3.

The warpage of the semiconductor device 17 is suppressed even in such a double-sided mounting structure, so that connectivity between the first semiconductor chip 7 and the second semiconductor chip 23 can be enhanced. The first and second semiconductor chips 7, 23 mounted on the both surfaces of the wiring layer 3 are mounted on a package substrate 26. The first and second semiconductor chips 7, 23 and the package substrate 26 are electrically connected via bonding wires 27. The entire first and second semiconductor chips 7, 23 mounted on the both surfaces of the wiring layer 3 are sealed by a sealing resin layer 28 formed on the package substrate 26, and thereby the semiconductor package 21 is formed.

Second Embodiment

Figure 11A:
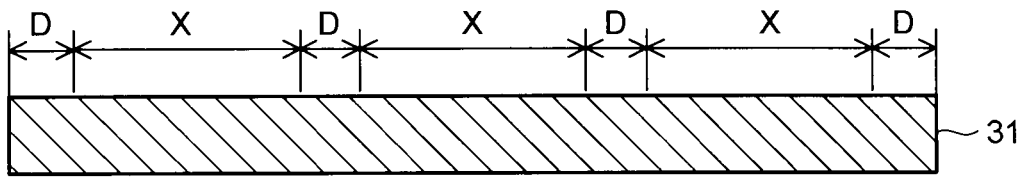
FIG. 11A to FIG. 11C are cross-sectional views showing a preparation process of a wiring substrate to a forming process of a sealing resin layer in a method for manufacturing a semiconductor device in a second embodiment.
Figure 11B:
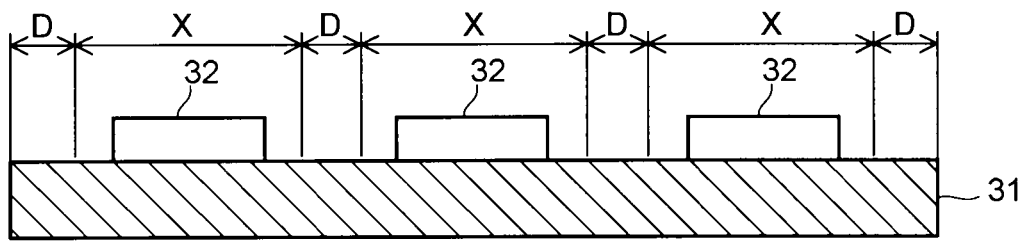

A method for manufacturing a semiconductor device according to a second embodiment will be explained with reference to the drawings. FIG. 11A to FIG. 11C and FIG. 12A and FIG. 12B are views showing a manufacturing process of the semiconductor device according to the second embodiment. First, as shown in FIG. 11A, a wiring substrate 31 having a plurality of device forming areas X and dicing areas D each provided therebetween is prepared. Next, as shown in FIG. 11B, a plurality of semiconductor chips 32 are mounted on the wiring substrate 31. The semiconductor chips 32 are disposed on the device forming areas X of the wiring substrate 31 respectively.

Figure 11C:
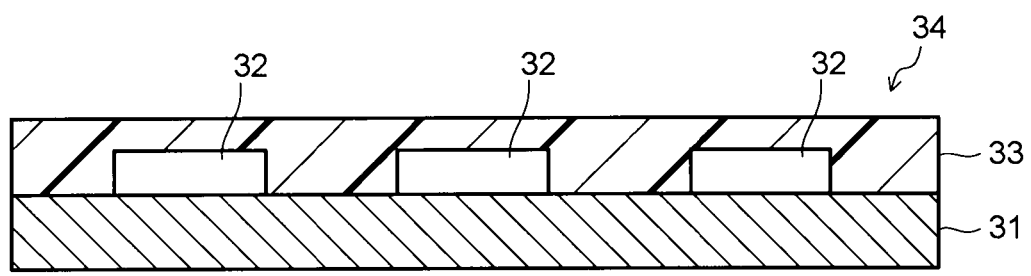

A mounting process of the semiconductor chips 32 is conducted by applying flip-chip (FC) connection, for example. The connection of the wiring substrate 31 and the semiconductor chips 32 is not limited to the FC connection, and the wiring substrate 31 and the semiconductor chips 32 may also be electrically connected in a manner to apply wire bonding. Next, as shown in FIG. 11C, a sealing resin layer 33 is formed on the wiring substrate 31. The sealing resin layer 33 is formed by molding or the like. The sealing resin layer 33 is formed so as to collectively cover the plurality of semiconductor chips 32 mounted on the wiring substrate 31. In this manner, a resin-sealed body 34 in which the plurality of semiconductor chips 32 mounted on the wiring substrate 31 are collectively sealed is manufactured.

Figure 12A:
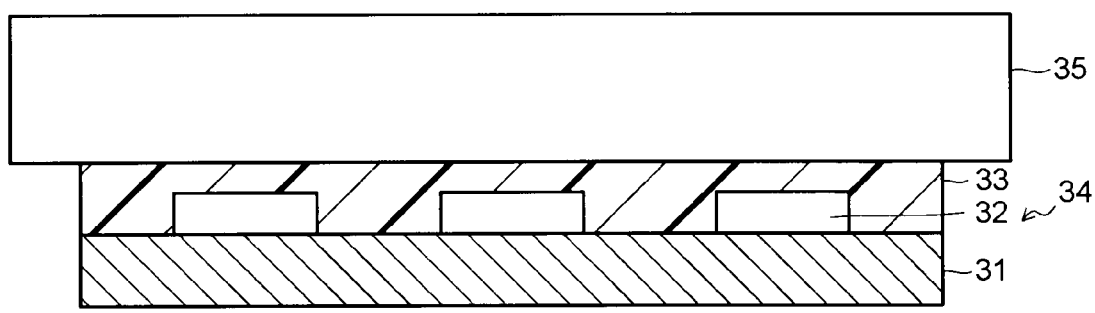
FIG. 12A and FIG. 12B are cross-sectional views showing a cooling process of a resin-sealed body in the method for manufacturing the semiconductor device in the second embodiment.

Next, as shown in FIG. 12A, the resin-sealed body 34 is evenly held by a holder 35. The holder 35 is provided with a suction-holding mechanism evenly holding the resin-sealed body 34. The resin-sealed body 34 is suction-held by the holder 35, and thereby the resin-sealed body 34 can be held more evenly. A holding mechanism of the resin-sealed body 34 may also be a mechanism fastening the resin-sealed body 34 mechanically. A heater (not-shown) is housed in the holder 35, and controlling output of the heater makes it possible to heat and cool the resin-sealed body 34 with a predetermined temperature gradient. As a heating mechanism, the previously described laser, halogen lamp, xenon lamp, IR heater, or the like may also be applied.

Then, the resin-sealed body 34 evenly held by the holder 35 is heated to a temperature equal to or higher than a glass transition point of the sealing resin layer 33 and then is cooled to a temperature lower than the glass transition point while a holding state is maintained. A heating condition and cooling condition of the resin-sealed body 34 are preferably set the same as those of the first embodiment. The resin-sealed body 34 is preferably heated to a temperature 5 to 15° C. higher than the glass transition point of the sealing resin. In a cooling process of the resin-sealed body 34, a temperature gradient of a temperature zone passing through the glass transition point of the sealing resin is preferably set to 10° C./minute or less. A temperature gradient in a temperature zone prior to the temperature zone passing through the above-described glass transition point and a temperature gradient in a temperature zone subsequent to the temperature zone passing through the glass transition point are preferably made larger than that of the temperature zone passing through the glass transition point. Other conditions are also preferably set the same as those of the first embodiment.

Figure 12B:
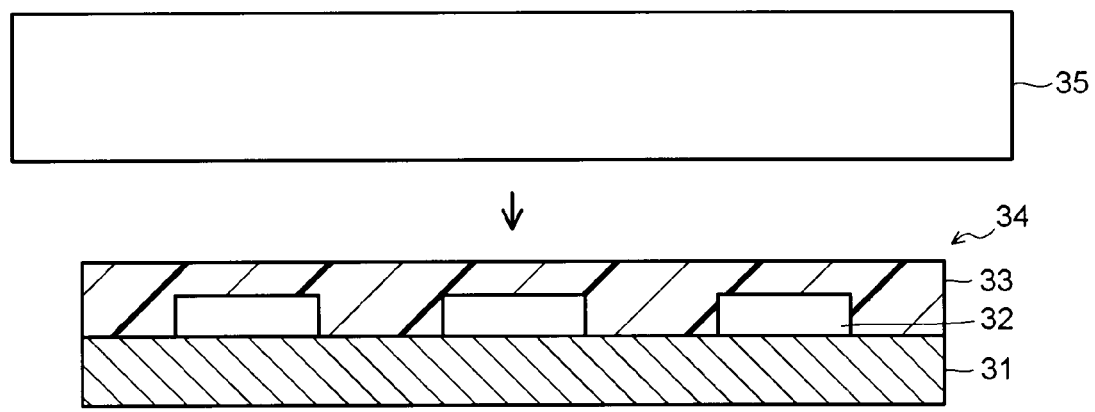

The resin-sealed body 34 is cooled based on the predetermined cooling condition, and then as shown in FIG. 12B, the holding state of the resin-sealed body 34 by the holder 35 is released. In this manner, the resin-sealed body 34 is heated and cooled while being held evenly by the holder 35, thereby enabling warpage of the resin-sealed body 34 to be corrected and suppressed. Thereafter, the resin-sealed body 34 is cut off to separate semiconductor devices into pieces. Each of the separated semiconductor devices is used for various packages and the like.

Third Embodiment

A method for manufacturing a semiconductor device according to a third embodiment will be explained with reference to the drawings. FIG. 13A to FIG. 13C and FIG. 14A to FIG. 14C are views showing a manufacturing process of the semiconductor device according to the third embodiment. In FIG. 13A to FIG. 13C and FIG. 14A to FIG. 14C, the manufacturing process of the single semiconductor device is shown, but the manufacturing method in the third embodiment is also applicable to a manufacturing process with a semiconductor substrate having a plurality of device forming areas similarly. In the above case, the similar manufacturing process is applied except that the semiconductor substrate is cut off along dicing areas finally, thereby separating the semiconductor devices into pieces.

Figure 13A:
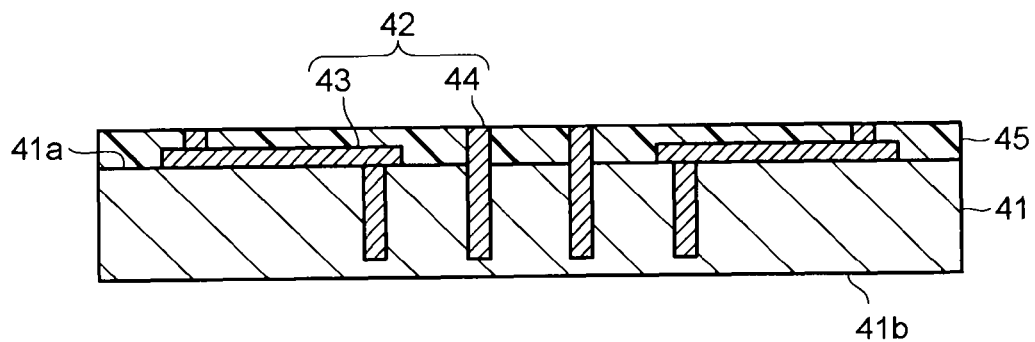
FIG. 13A to FIG. 13C are cross-sectional views showing a forming process of a wiring layer to a process of shaving a semiconductor substrate in a method for manufacturing a semiconductor device in a third embodiment.

First, as shown in FIG. 13A, a wiring layer 42 is formed on a side of a first surface 41a of a semiconductor substrate 41. The wiring layer 42 has a conductor layer 43 formed on the first surface 41a of the semiconductor substrate 41 and conductor filling layers 44 to be through electrodes. The conductor filling layers 44 are formed to fill or plate a conductive material in grooves provided in the semiconductor substrate 41. An insulating resin layer 45 is formed on the first surface 41a of the semiconductor substrate 41 to cover the wiring layer 42. The insulating resin layer 45 functions as a protective film of the wiring layer 42.

Figure 13B:
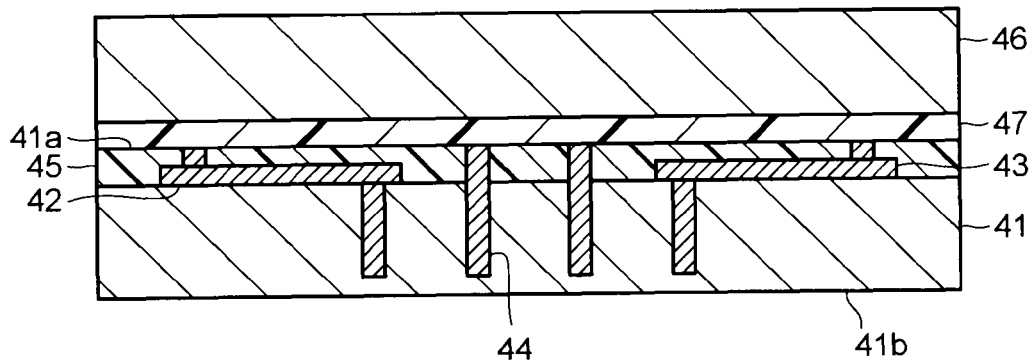

Next, as shown in FIG. 13B, a supporting substrate 46 is bonded to the first surface 41a of the semiconductor substrate 41 via the insulating resin layer 45. The supporting substrate 46 is bonded to the semiconductor substrate 41 by an adhesive layer 47. The adhesive layer 47 is preferably formed of an adhesive made of a thermoplastic resin such that the adhesive layer 47 is likely to be peeled off when being heated in a subsequent separation process. As will be described later, in the case when heating/cooling processes are conducted separately from the separation process, an adhesive made of an ultraviolet-curing resin or the like may also be used.

Figure 13C:
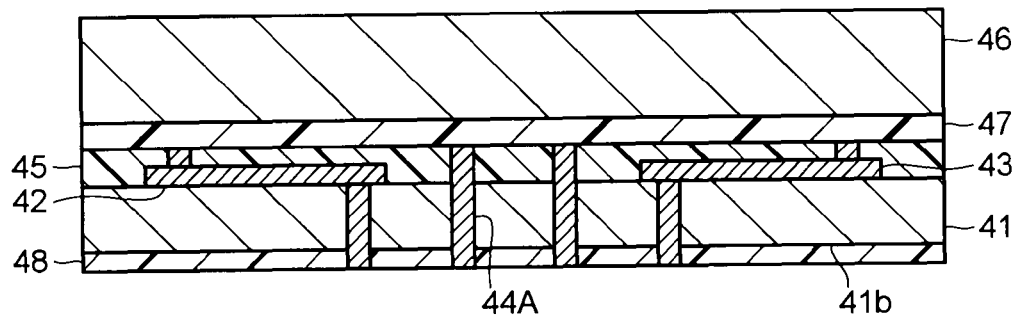

As shown in FIG. 13C, a second surface 41b of the semiconductor substrate 41 is shaved by mechanical grinding, etching or the like, and thereby the semiconductor substrate 41 is thinned. The second surface 41b of the semiconductor substrate 41 is shaved such that the conductor filling layers 44 are exposed. Thereby, through electrodes 44A passing through the semiconductor substrate 41 are formed. An insulating film 48 is formed on the second surface 41b of the semiconductor substrate 41 in a manner that the through electrodes 44A are exposed.

Figure 14A:
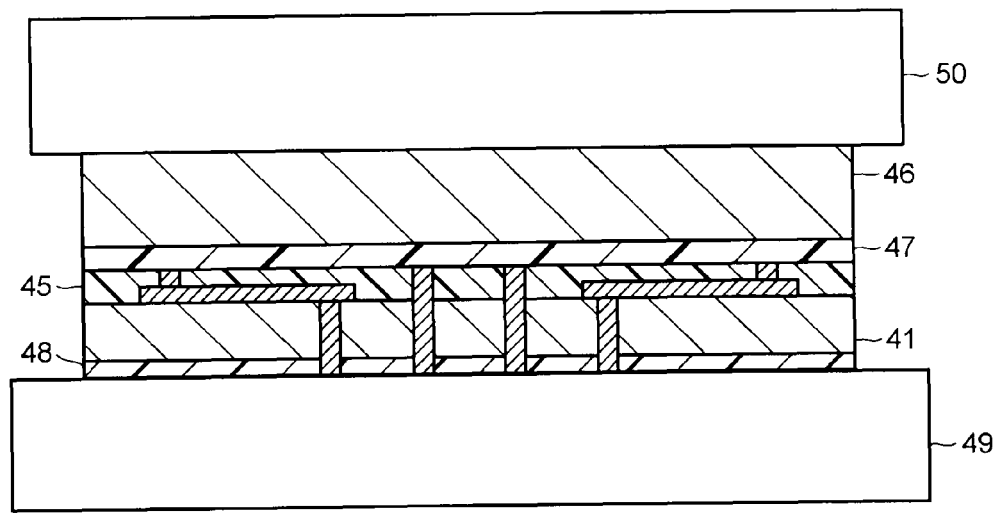
FIG. 14A to FIG. 14C are cross-sectional views showing a separation process of the semiconductor substrate to a cooling process of the semiconductor substrate in the method for manufacturing the semiconductor device in the third embodiment.

Next, as shown in FIG. 14A, the semiconductor substrate 41 is evenly held by a first holder 49 and the supporting substrate 46 is evenly held by a second holder 50. The first and second holders 49, 50 are each provided with a suction-holding mechanism evenly holding the semiconductor substrate 41 or the supporting substrate 46. A heater (not-shown) is housed in the first holder 49, and controlling output of the heater makes it possible to heat and cool the semiconductor substrate 41 with a predetermined temperature gradient. As a heating mechanism, the previously described laser, halogen lamp, xenon lamp, IR heater, or the like may also be applied. A heating mechanism and the like are also housed in the second holder 50 according to need.

Figure 14B:
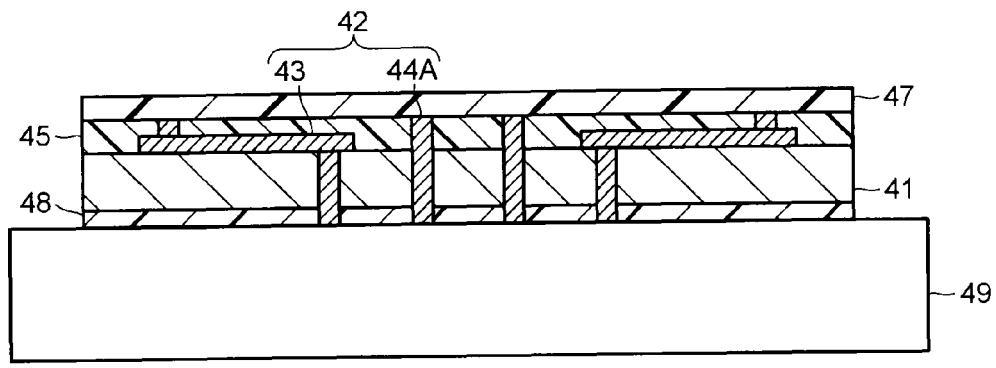

Then, the semiconductor substrate 41 evenly held by the first holder 49 is heated to a temperature capable of softening the adhesive layer 47 to peel off the supporting substrate 46. In this state, the first and second holders 49, 50 are relatively moved, and thereby the semiconductor substrate 41 is separated from the supporting substrate 46. The semiconductor substrate 41 separated from the supporting substrate 46, as shown in FIG. 14B, is cooled while a state of the semiconductor substrate 41 being held evenly by the first holder 49 is maintained.

In the cooling process of the semiconductor substrate 41, the semiconductor substrate 41 is heated to a temperature equal to or higher than a glass transition point of the insulating resin layer 45 continuously from the separation process, and then is cooled to a temperature lower than the glass transition point. Or it is also possible that a holding state of the semiconductor substrate 41 by the first holder 49 is once released and the semiconductor substrate 41 is cooled, and then the semiconductor substrate 41 is evenly held by the first holder 49 again, and the above-described heating process and cooling process are performed. Also in the both cases, an effect of suppressing warpage of the semiconductor substrate 41 can be obtained.

A heating condition and cooling condition of the semiconductor substrate 41 are preferably set the same as those of the first embodiment. The semiconductor substrate 41 is preferably heated to a temperature 5 to 15° C. higher than the glass transition point of the insulating resin. In the cooling process of the semiconductor substrate 41, a temperature gradient of a temperature zone passing through the glass transition point of the insulating resin is preferably set to 10° C./minute or less. A temperature gradient in a temperature zone prior to the temperature zone passing through the above-described glass transition point and a temperature gradient in a temperature zone subsequent to the temperature zone passing through the glass transition point are preferably made larger than that of the temperature zone passing through the glass transition point. Other conditions are also preferably set the same as those of the first embodiment.

Figure 14C:
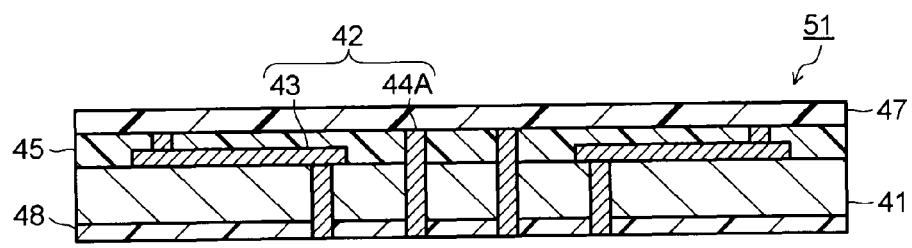

As shown in FIG. 14C, the semiconductor substrate 41 is cooled based on the predetermined cooling process, and then the holding state of the semiconductor substrate 41 by the first holder 49 is released, and thereby a semiconductor device 51 is obtained. The semiconductor substrate 41 is heated and cooled while being evenly held by the holder 49, and thereby warpage of the semiconductor device 51 can be corrected and suppressed. The semiconductor substrate 41 is not limited to one including an active element, and may also be one having only wirings. Further, it is also possible to apply the manufacturing process according to the third embodiment to a structure in which other active chips are mounted on the semiconductor substrate 41.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method for manufacturing a semiconductor device, comprising:
    forming a separation layer on a supporting substrate;
    forming a wiring layer having a plurality of device forming areas and dicing areas on the separation layer;
    mounting a plurality of semiconductor chips on the wiring layer such that the semiconductor chips are disposed on the plural device forming areas respectively;
    forming a sealing resin layer covering the plural semiconductor chips on the wiring layer to obtain a resin-sealed body having the wiring layer and the plural semiconductor chips;
    separating the resin-sealed body from the supporting substrate; and
    cutting the resin-sealed body according to the dicing areas to singulate a circuit structure body provided with the wiring layer, the semiconductor chip and the sealing resin layer,
    wherein, when the resin-sealed body is separated from the supporting substrate, or after the resin-sealed body is separated from the supporting substrate, the resin-sealed body is heated while being evenly held by a holder as a whole, and
    wherein the resin-sealed body is cooled while a state of the resin-sealed body being held evenly by the holder is maintained, and then a holding state of the resin-sealed body by the holder is released.

2. The manufacturing method according to claim 1, wherein the resin-sealed body is evenly held by a first holder as a whole, and the supporting substrate is held by a second holder, and
    wherein the resin-sealed body is separated from the supporting substrate by moving the first holder and the second holder relatively while heating the resin-sealed body and the separation layer.

3. The manufacturing method according to claim 2, wherein the separation layer is made of a thermoplastic resin, and
wherein the resin-sealed body is separated from the supporting substrate by shearing the heated separation layer.

4. The manufacturing method according to claim 1, wherein the resin-sealed body is separated from the supporting substrate, and
wherein the resin-sealed body separated from the supporting substrate is heated while being held evenly by the holder as a whole.

5. The manufacturing method according to claim 4, wherein the resin-sealed body is separated from the supporting substrate by shearing the separation layer, melting the separation layer, etching the separation layer, curing the separation layer with light, or decomposing the separation layer with light.

6. The manufacturing method according to claim 1, wherein the resin-sealed body is heated to a temperature 5 to 15° C. higher than a glass transition point of the sealing resin.

7. The method for manufacturing the semiconductor device, according to claim 6,
wherein the resin-sealed body is cooled to a temperature lower than the glass transition point, and then the holding state by the holder is released.

8. The manufacturing method according to claim 7, wherein a temperature gradient of a temperature zone passing through the glass transition point is in a range of 1 to 10° C./minute.

9. The manufacturing method according to claim 7, wherein a temperature gradient in a temperature zone prior to the temperature zone passing through the glass transition point and a temperature gradient in a temperature zone subsequent to the temperature zone passing through the glass transition point are larger than that in the temperature zone passing through the glass transition point.

10. The manufacturing method according to claim 1, wherein the resin-sealed body held by the holder is cooled by being in contact with a radiator.

11. A method for manufacturing a semiconductor device, comprising:
    preparing a wiring substrate having a plurality of device forming areas and dicing areas;
    mounting a plurality of semiconductor chips on the wiring substrate such that the semiconductor chips are disposed on the plural device forming areas respectively;
    forming a sealing resin layer covering the plural semiconductor chips on the wiring substrate to obtain a resin-sealed body having the wiring substrate and the plural semiconductor chips;
    heating the resin-sealed body while being evenly held by a holder;
    cooling the resin-sealed body while a state of the resin-sealed body being held evenly by the holder is maintained, and then releasing a holding state of the resin-sealed body by the holder; and
    cutting the resin-sealed body according to the dicing areas to singulate a circuit structure body provided with the wiring substrate, the semiconductor chip and the sealing resin layer.

12. The manufacturing method according to claim 11, wherein the resin-sealed body is heated to a temperature 5 to 15° C. higher than a glass transition point of the sealing resin.

13. The manufacturing method according to claim 12,
wherein the resin-sealed body is cooled to a temperature lower than the glass transition point, and then the holding state by the holder is released.

14. The manufacturing method according to claim 13,
wherein a temperature gradient of a temperature zone passing through the glass transition point is in a range of 1 to 10° C./minute.

15. The manufacturing method according to claim 13,
wherein a temperature gradient in a temperature zone prior to the temperature zone passing through the glass transition point and a temperature gradient in a temperature zone subsequent to the temperature zone passing through the glass transition point are larger than that in the temperature zone passing through the glass transition point.

16. A method for manufacturing a semiconductor device, comprising:
preparing a semiconductor substrate having a first surface and a second surface;
forming a wiring layer including through electrodes at the first surface side of the semiconductor substrate;
forming an insulating resin layer on the semiconductor substrate to cover the wiring layer;
bonding a supporting substrate to the semiconductor substrate via the insulating resin layer by an adhesive layer;
grinding the second surface of the semiconductor substrate; and
separating the semiconductor substrate from the supporting substrate,
wherein, when the semiconductor substrate is separated from the supporting substrate, or after the semiconductor substrate is separated from the supporting substrate, the semiconductor substrate is heated while being held evenly by a holder as a whole, and
wherein the semiconductor substrate is cooled while a state of the semiconductor substrate being held evenly by the holder is maintained, and then a holding state of the semiconductor substrate by the holder is released.

17. The manufacturing method according to claim 16,
wherein the semiconductor substrate is evenly held by a first holder as a whole, and the supporting substrate is held by a second holder, and
wherein the semiconductor substrate is separated from the supporting substrate by moving the first holder and the second holder relatively while heating the semiconductor substrate and the adhesive layer.

18. The manufacturing method according to claim 16,
wherein the semiconductor substrate is heated to a temperature 5 to 15° C. higher than a glass transition point of the insulating resin.

19. The manufacturing method according to claim 18,
wherein the semiconductor substrate is cooled to a temperature lower than the glass transition point, and then the holding state by the holder is released.

20. The manufacturing method according to claim 19,
wherein a temperature gradient of a temperature zone passing through the glass transition point is set to fall within a range of 1 to 10° C./minute.

* * * * *